United States Patent [19]

Van Opdorp

[11] Patent Number: 4,903,088
[45] Date of Patent: Feb. 20, 1990

[54] SEMICONDUCTOR LASER WITH LARGE BANDGAP CONNECTION LAYER

[75] Inventor: Christianus J. M. Van Opdorp, Eindhoven, Netherlands

[73] Assignee: U.S. Philips Corp., New York, N.Y.

[21] Appl. No.: 209,446

[22] Filed: Jun. 20, 1988

[30] Foreign Application Priority Data

Jun. 26, 1987 [NL] Netherlands .......................... 8701497

[51] Int. Cl.$^4$ ............................................ H01L 33/00
[52] U.S. Cl. ...................................... 357/17; 357/16; 357/56; 372/74; 372/44; 372/43
[58] Field of Search ............... 357/17, 16, 56; 372/74, 372/44, 43

[56] References Cited

U.S. PATENT DOCUMENTS

| 4,149,174 | 4/1979 | Shannon | 357/15 X |
| 4,631,731 | 12/1986 | Wolter et al. | 372/74 |
| 4,740,976 | 4/1988 | Kajimura et al. | 357/17 X |
| 4,750,183 | 6/1988 | Takahashi et al. | 372/44 X |
| 4,794,606 | 12/1988 | Kondow et al. | 372/44 X |

FOREIGN PATENT DOCUMENTS 57-206083 12/1982 Japan ................................ 372/44 X Primary Examiner—William Mintel
Attorney, Agent, or Firm—Steven R. Biren

[57] ABSTRACT

A semiconductor device for producing electro-magnetic radiation consisting of a radiation-emitting element (LED or laser) and an injection element, which can inject hot charge carriers into the active layer of the radiation-emitting element composed of layers of one conductivity type. With the use of active layers having a large band gap, for example GaN, short-wave light can be generated. According to the invention, the radiation-emitting element and the injection element constitute parts of the same epitaxial layer structure, the active layer being connected to the injection element by means of a semiconductor connection layer having a band gap larger than that of the active layer and that of the adjoining layer of the injection element.

7 Claims, 2 Drawing Sheets

SEMICONDUCTOR LASER WITH LARGE BANDGAP CONNECTION LAYER

BACKGROUND OF THE INVENTION

The invention relates to a semiconductor device for producing electromagnetic radiation and having a semiconductor body comprising a radiation-emitting element having an active layer, in which active layer electromagnetic radiation can be produced by injection of hot charge carriers, and an injection element, in which the said hot charge carriers are generated by avalanche multiplication, the radiation-emitting element and the injection element each having a monocrystalline epitaxial layer structure.

A semiconductor device of the kind described above is known from U.S. Pat. No. 4,631,731, FIG. 6.

Semiconductor devices for producing electro-magnetic radiation have been frequently used for several years in different fields of technology. They comprise an active semiconductor material of the socalled direct band transition type having mostly one or several radiation-emitting pn junctions and they can be used in devices whose radiation is not coherent and devices whose radiation is coherent. In the former case, these devices are generally designated as LED's (Light-Emitting Diodes), while in the latter case these devices are designated as lasers.

The radiation emitted by conventional semiconductor lasers generally has a wavelength of about 700 nm or larger. However, there is a great demand for lasers and LED's generating radiation of a shorter wavelength. More particularly this is the case4 with the use of these devices for optically reading-in and reading-out information ("digital optical recoding"=DOR). The attainable information density increases in inverse proportion to the square value of the wavelength of the radiation used. A further advantage is that at shorter wavelengths the optics used can be simpler.

In order to obtain LED's or lasers for such short wavelengths, for example from green to ultraviolet, use must be made of "direct" semiconductor materials having a large bend gap. The problem is that such materials, such as, for example, gallium nitride, zinc telluride, cadmium sulphide, zinc sulphide etc., in practice can be doped either only n-type or only p-type.

Therefore, it is substantially not possible to realize with these materials LED's or lasers by means of injection via a pn "homo" junction. With these materials, injection via pn hetero-junctions is in practice not possible either because substantially no "pairs" of semiconductor materials exist which simultaneously satisfy all necessary conditions, i.e. that:

1. sufficiently large band gaps, the materials having the smallest band gap being at the same time a "direct" semiconductor, are available;
2. the possibility of opposite doping of both materials exists, and
3. the lattice adaptation between both materials is sufficient.

Therefore, use must be made of other methods of injecting charge carriers. It is proposed in the aforementioned, U.S. Pat. No. 4631731 to inject for this purpose into the LED material or laser material "hot" charge carriers, i.e. electrons or holes having an energy larger than that corresponding to thermodynamic equilibrium, via an intermediate isolating layer. These hot charge carriers are supplied by a semiconductor cathode, which is separated by the isolating layer from the radiation-emitting element.

For various reasons, it is very difficult to realize such a device. In the first place, a very thin isolating layer would have to be used. The forbidden band width of an isolator is in fact so large that the injected hot charge carriers cannot pass this threshold or can pass it only with great difficulty. Further, also in connection with the fact that the structure is not monocrystalline, but consists of two parts each having its own crystal lattice mutually separated by a non-mono-crystalline isolating layer, the life of the injected hot charge carriers will be short, as a result of which the device cannot operate at all or cannot operate to the optimum.

SUMMARY OF THE INVENTION

The invention has inter alia for its object to provide a semiconductor device, in which the said disadvantages are avoided or are at least reduced to a considerable extent.

The invention is based inter alia on the recognition of the fact that the object aimed at can be achieved by the use of a semiconductor structure which is constructed entirely epitaxially.

According to the invention, a semiconductor device of the kind described above is characterized in that the layer structures of the radiation-emitting element and of the injection element adjoin each other epitaxially and the active layer is connected to the injection element by a semiconductor connection layer having a band gap larger than that of the active layer and that of the adjoining layer of the injection element, the materials of the active layer and of the connection layer being chosen so that at their interface the lower level of the conduction band in the active layer lies below the lower level of the conduction band in the connection layer, and the upper level of the valency band in the active layer lies above the upper level of the valency band in the connection layer.

Due to the fact that the whole layer structure of the semiconductor device practically forms a single crystal lattice, the life of the hot charge carriers injected by the injection element can be kept at an admissible level. Further, due to the presence of the epitaxial connection layer, the injection of charge carriers from the active layer into the injection element will be prevented, which will improve the operation of the device.

According to a first preferred embodiment, the injection element comprises a pn junction, which in the operating condition is biassed in the reverse direction and supplies by avalanche multiplication within the injection element the said hot charge carriers.

The injection element can be constituted by an avalanche diode of arbitrary structure of by a so-called "cold cathode". According to a further preferred embodiment, the injection element is constituted by a layer structure, which comprises a "camel diode". This layer structure may also be in the form of a hot-electron or hot-hole transistor. "Camel diodes" and hot charge carrier transistors have been described in U.S. Pat. No. 4,149,174 and in British Patent Specification 2056166.

A favorable material for the manufacture of the active layer of the radiation-emitting element is gallium nitride. This is a semiconductor material of the "direct" type having a band gap of 3.4 eV, which therefore can emit radiation having a wavelength of about 365 nm, which wavelength lies in the near ultraviolet range.

Moreover, the lattice constant of this material matches reasonable with that of silicon so that an injection element comprising a silicon layer structure can be epitaxially connected to a layer structure on the basis of gallium nitride without very serious problems arising. The connection layer between the two layer structures can then advantageously consist of aluminum gallium nitride having the composition $Al_xGa_{1-x}N$.

It is of importance that the connection layer not only is not too thick, but also is not too thin. With too thin a connection layer, in fact radiation can leak away from the active layer 3 to the injection element and can thus give rise to optical coupling loss. For a connection layer of aluminum gallium nitride, the thickness is therefore preferably at least 0.2 μm and at most 0.3 μm.

The invention is of interest both for devices (LED's) emitting non-coherent radiation and for lasers. However, the invention is of particular importance for a preferred embodiment, in which the radiation-emitting element is a semiconductor laser having an active layer located between the connection layer serving as a first cladding layer and a second cladding layer having the same conductivity type as the connection layer, this second cladding layer being connected to a connection conductor.

BRIEF DESCRIPTION OF THE DRAWING

The invention will now be described more fully with reference to an embodiment and the drawing, in which.

DESCRIPTION OF THE PREFERRED EMBODIMENTS

Figure 1:
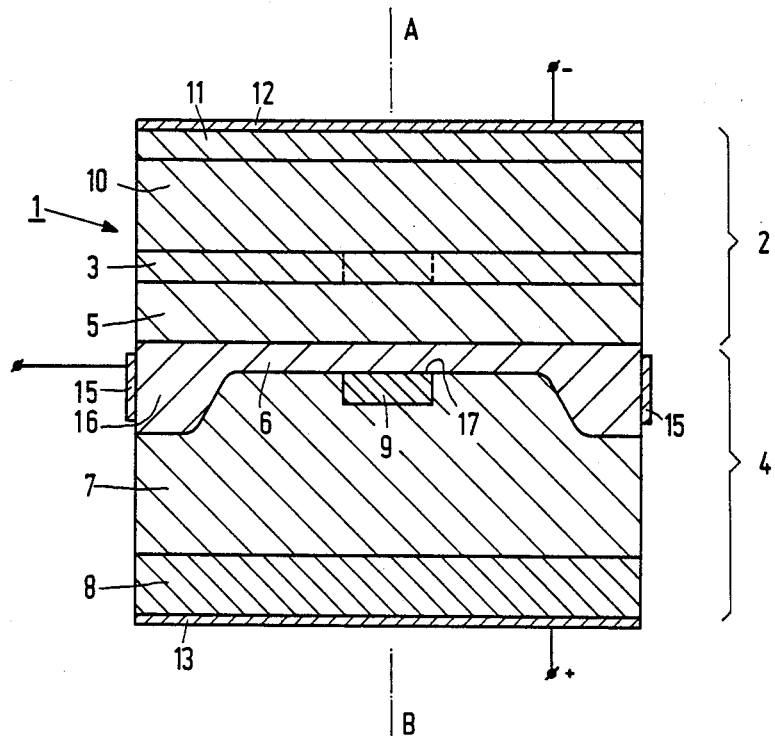
FIG. 1 shows diagrammatically in cross-section a semiconductor device according to the invention.

FIG. 1 shows diagrammatically in cross-section a semiconductor device according to the invention for producing electromagnetic radiation. The device has a semiconductor body 1, which comprises a radiation-emitting element 2 having an active layer 3 consisting in this embodiment of n-type gallium nitride. Electro-magnetic radiation can be produced in this active layer by injection of "hot" holes. All the layers of the device are <111>-orientated.

These hot holes are supplied by an injection element 4, which is constituted in this embodiment by a silicon layer structure, in which the said hot holes are generated by avalanche multiplication. Both the radiation-emitting element 2 and the injection element 4 comprise a <111>-orientated monocrystalline epitaxial layer structure.

According to the invention, the layer structures of the radiation-emitting element 2 and of the injection element 4 adjoin each other epitaxially. The active layer 3 is connected to the injection element 4 by means of a semiconductor connection layer 5 having a band gap (energy gap) larger than that of the active layer 3 and also larger than that of the adjoining layer 6 of the injection element 4. Moreover, the materials of the active layer 3 and of the connection layer 5 are chosen so that (cf. FIG. 2) at their interface the lower level ($E_C$) of the conduction band in the active layer lies below the lower level of the conduction band in the connection layer 5 and that the upper level ($E_V$) of the valency band in the active layer 3 lies above the upper level of the valency band in the connection layer 5.

In this embodiment, the connection layer 5 consists of n-type gallium aluminun nitride. The injection element 4 in this embodiment consists of a highly doped p-type silicon layer 6, an n-type silicon layer 7, a highly doped n-type silicon layer 8 and a strip-shaped highly doped n-type zone 9 provided in the layer 7, having a width of about 2 μm and extending at right angles to the plane of the drawing. Further, in this embodiment, the radiation-emitting element 2 is constructed as a laser and the active layer 3 is disposed between the connection layer 5 acting as the first cladding layer and a second cladding layer 10 having the same composition and the same conductivity type as the layer 5. This second cladding layer 10 is connected (via a highly doped n-type contact layer 11 of gallium nitride) to a connection conductor 12. Another connection conductor 13 forms an ohmic contact with the layer 8. The active layer 3 is bounded at the ends by end faces of the crystal, which extend parallel to the plane of the drawing, serve as mirror faces and thus constitute a Fabry-Pèrot resonant cavity, the radiation emanating at one of the mirror faces in a direction at right angles to the plane of the drawing. An electrode 15 forms via a p+contact zone 16 ohmic contact on the layer 6.

Figure 2:
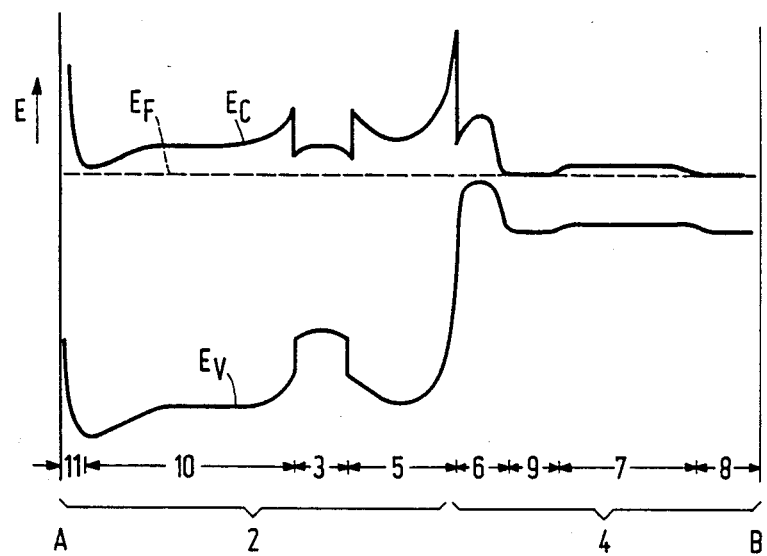
FIG. 2 shows an energy diagram of the semiconductor device shown in FIG. 1 taken on the line AB in unbiassed condition.

FIG. 2 shows the energy diagram taken on the line AB in the unbiassed condition. It will be appreciated that due to the energy barrier a "normal" injection of holes from the P-type silicon layer 6 into the n-type gallium nitride layer 3 is substantially excluded.

Figure 3:
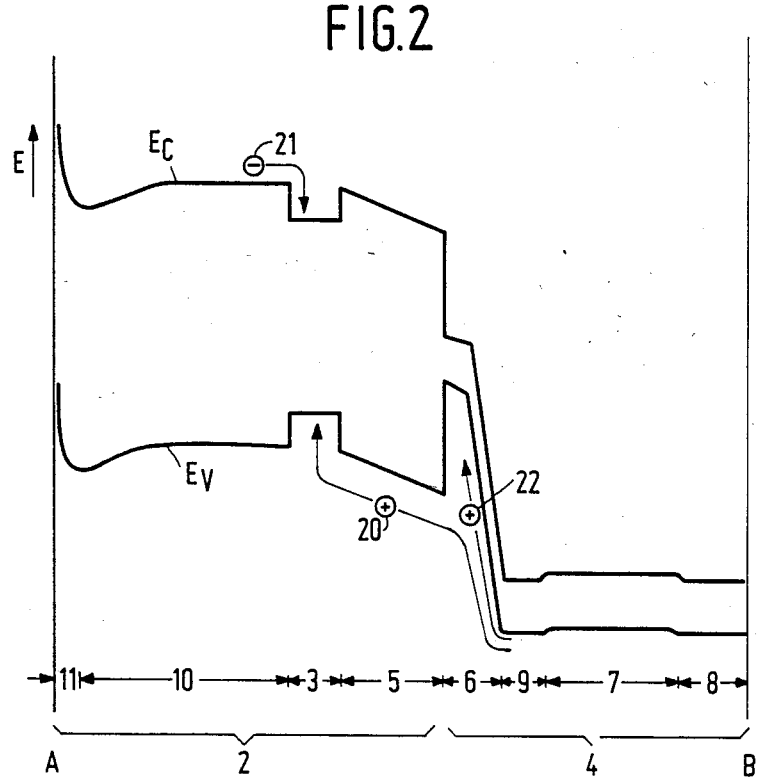
FIG. 3 shows an energy diagram of the semiconductor device shown in FIG. 1 taken on the line AB in the operating condition.

In the operating condition, however, such a high positive voltage with respect to the electrode 12 is applied to the electrode 13 that avalanche multiplication occurs near the pn junction 17, as a result of which electron-hole pairs are formed having a higher energy than that corresponding to the temperature of the crystal lattice. The energy diagram then approximately takes the form shown in FIG. 3. From the layer 6, "hot" holes 20 are injected across the barrier 5/6 into the layer 3, while from the layer 10 electrons 21 are injected into a strip-shaped active region (indicated in FIG. 1 diagrammatically by dotted lines) of the layer 3. With a sufficient injection, a laser effect is obtained in the active region of the layer 3. The holes 22, which have insufficient energy to pass through the barrier 5/6, must be drained laterally via the layer 6, which can take place via the electrode 15 (FIG. 1).

In this embodiment, the various semiconductor layers on the line AB have the following compositions and thickness:

| Layer | Composition | Type | Doping at/cm³ | Thickness (μm) |
|---|---|---|---|---|
| 8 | Si | N | $5 \times 10^{19}$ | 200 |
| 7 | Si | N | $2 \times 10^{16}$ | 6 |
| 6 | Si | P | $4 \times 10^{19}$ | 0.010 |

-continued

| Layer | Composition | Type | Doping at/cm$^3$ | Thickness ($\mu$m) |
|---|---|---|---|---|
| 9 | Si | N | $10^{18}$ | 2 |
| 5 | Al$_{0.25}$Ga$_{0.75}$N | N | $10^{18}$ | 0.25 |
| 3 | GaN | N | $10^{17}$ | 0.2 |
| 10 | Al$_{0.25}$Ga$_{0.75}$N | N | $10^{19}$ | 1 |
| 11 | GaN | N | $10^{20}$ | 0.2 |

The device described can be manufactured by the use of conventional techniques of epitaxial growth from the liquid phase or from the gaseous phase. Extensive literature about this subject matter is available for those skilled in the art.

As has already been stated, other structures may also be used as an injection element. For example, the injection element 4 may be constructed as a "camel diode".

Figure 4:
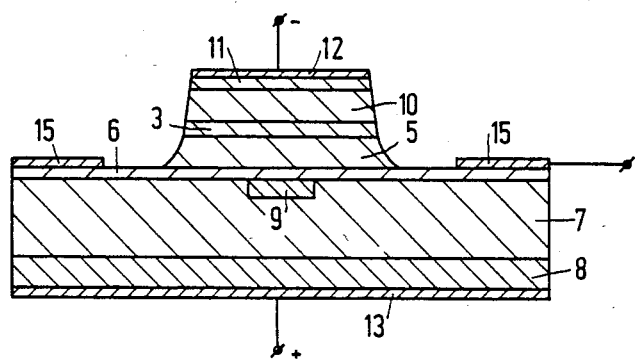
FIG. 4 shows a cross-section of another embodiment of the device according to the invention. Now the figures are purely schematic and not drawn to scale, while more particularly the dimensions in the direction of thickness are exaggerated. Corresponding parts are generally designated by the same reference numerals and in the cross-sections semiconductor regions of the same conductivity type are generally cross-hatched in the same direction.

It is further important to note that FIG. 1 indicates only a schematic construction in the direction of thickness of the semiconductor device and that especially the step of contacting the layer 6 may be carried out in many ways obvious to those skilled in the art, for example by means of a mesa structure, as shown diagrammatically in Fig.4, in which the reference numerals correspond to those in FIG. 1.

It will be appreciated that the invention is not limited to the embodiment described and that especially instead of the materials mentioned other suitable III-V or II-VI materials many be used, while in given cases the radiation-emitting element may be composed of p-type layers instead of of n-type layers. Further, the required hot charge carriers may also be supplied by injection elements having a construction different from that described here.

What is claimed is:

1. A semiconductor device for production electromagnetic radiation having a semiconductor body comprising a radiation-emitting element having an active layer, in which active layer electromagnetic radiation can be produced by injection of hot charge carriers, and an injection element, in which the said hot charge carriers are generated by avalanche multiplication, the radiation-emitting element and the injection element each comprising a monocrystalline epitaxial layer structure, characterized in that the layer structures of the radiation-emitting element and of the injection element adjoin each other epitaxially and the active layer is connected to the injection element by means of a semiconductor connection layer having a band gap larger than that of the active layer and that of the adjoining layer of the injection element, the materials of the active layer and of the connection layer being chosen so that at their interface the lower level of the conduction band in the active layer lies below the lower level in the conduction band in the connection layer and the upper level of the valency band in the active layer lies above the upper level of the valency band in the connection layer.

2. A semiconductor device as claimed in claim 1, characterized in that the injection element comprises a pn junction, which in the operating condition is biased in the reverse direction and supplies the said hot charge carriers by avalanche multiplication within the injection element.

3. A semiconductor device as claimed in claim 1, characterized in that the injection element is constituted by a layer structure comprising a camel diode.

4. A semiconductor device as claimed in claims 1, 2, or 3, characterized in that the radiation-emitting element has an active layer of gallium nitride and in that the injection layer comprises a silicon layer structure.

5. A semiconductor device as claimed in claim 4, characterized in that the connection layer comprises aluminum gallium nitride.

6. A semiconductor device as claimed in claim 5, characterized in that the connection layer has a thickness of at least 0.2 $\mu$m and at most 0.3 $\mu$m.

7. A semiconductor device as claimed in claims 1, 2 or 3, characterized in that the radiation-emitting element is a semiconductor laser having an active layer disposed between the semiconductor connection layer serving as the first cladding layer and a second cladding layer having the same composition and the same conductivity type as the connection layer, which is connected to a connection conductor.

* * * * *